(12) United States Patent
Nakamura et al.

(10) Patent No.: US 12,174,256 B2
(45) Date of Patent: Dec. 24, 2024

(54) DEVICE MONITORING DEVICE AND DEVICE MONITORING METHOD

(71) Applicant: Hitachi, Ltd., Tokyo (JP)

(72) Inventors: Akihiro Nakamura, Tokyo (JP); Koichiro Nagata, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 306 days.

(21) Appl. No.: 17/907,846

(22) PCT Filed: Oct. 13, 2020

(86) PCT No.: PCT/JP2020/038614
§ 371 (c)(1),
(2) Date: Aug. 29, 2022

(87) PCT Pub. No.: WO2021/176761
PCT Pub. Date: Sep. 10, 2021

(65) Prior Publication Data
US 2023/0102125 A1    Mar. 30, 2023

(30) Foreign Application Priority Data
Mar. 3, 2020  (JP) .................... 2020-035896

(51) Int. Cl.
*G01R 31/34* (2020.01)
*G01R 19/00* (2006.01)
(Continued)

(52) U.S. Cl.
CPC ....... *G01R 31/343* (2013.01); *G01R 19/0092* (2013.01); *H02P 21/14* (2013.01); *H02P 23/14* (2013.01); *H02P 27/06* (2013.01)

(58) Field of Classification Search
CPC .......... H02P 27/06; H02P 21/14; H02P 23/14; H02P 21/143; G01R 31/343; G01R 19/0092
(Continued)

(56) References Cited

U.S. PATENT DOCUMENTS

2009/0237015 A1*  9/2009  Hashimoto ......... H02P 21/0089
                                                            318/400.02
2013/0278185 A1*  10/2013  Suzuki ................... H02P 21/14
                                                            318/400.02
(Continued)

FOREIGN PATENT DOCUMENTS

JP          2-163290 A        6/1990
JP          3-89884 A         4/1991
(Continued)

OTHER PUBLICATIONS

International Search Report (PCT/ISA/210) issued in PCT Application No. PCT/JP2020/038614 dated Dec. 22, 2020 with English translation (six (6) pages).
(Continued)

*Primary Examiner* — Gabriel Agared
(74) *Attorney, Agent, or Firm* — Crowell & Moring LLP (57) ABSTRACT

The purpose of the present invention is to provide a device monitoring technique having little restriction even on application to an already-existing device or facilitating monitoring even when a device to be monitored is in variable speed operation or under load variation. One of the representative device monitoring devices of the present invention monitors a device system using, as a power source, an AC electric motor driven by an inverter and is provided with a torque current estimation unit and a state estimation unit. The torque current estimation unit acquires information about AC currents of at least two phases and excitation current of the AC electric motor and calculates a torque current esti-
(Continued)

mated value of the AC electric motor on the basis of the AC currents and the excitation current. The state estimation unit estimates the state of the device system from information including at least one of the feature amounts extracted from the torque current estimated value.

13 Claims, 9 Drawing Sheets

(51) Int. Cl.
    *H02P 21/14* (2016.01)
    *H02P 23/14* (2006.01)
    *H02P 27/06* (2006.01)

(58) Field of Classification Search
    USPC .................................................. 318/400.04
    See application file for complete search history.

(56) References Cited

U.S. PATENT DOCUMENTS

| | | | | |
|---|---|---|---|---|
| 2017/0179867 A1* | 6/2017 | Shibata | ................ | H02P 29/032 |
| 2018/0083555 A1* | 3/2018 | Kori | ......................... | H02P 1/50 |
| 2018/0278197 A1* | 9/2018 | Kubo | .................... | H02P 29/032 |
| 2018/0375459 A1 | 12/2018 | Tsugawa | | |
| 2020/0235689 A1* | 7/2020 | Miyashita | .......... | G03G 15/5008 |

FOREIGN PATENT DOCUMENTS

| | | |
|---|---|---|
| JP | 2010-81743 A | 4/2010 |
| JP | 2010-200584 A | 9/2010 |
| JP | 2012-76168 A | 4/2012 |
| JP | 2013-78200 A | 4/2013 |
| JP | 2015-61492 A | 3/2015 |
| JP | 2016-195524 A | 11/2016 |
| WO | WO 2017/110855 A1 | 6/2017 |
| WO | WO 2019/049188 A1 | 3/2019 |
| WO | WO 2019/163125 A1 | 8/2019 |

OTHER PUBLICATIONS

Japanese-language Written Opinion (PCT/ISA/237) issued in PCT Application No. PCT/JP2020/038614 dated Dec. 22, 2020 (four (4) pages).

\* cited by examiner

DEVICE MONITORING DEVICE AND DEVICE MONITORING METHOD

TECHNICAL FIELD

The present invention relates to a device monitoring device and a device monitoring method.

BACKGROUND ART

Conventionally, unexpected abnormalities and failures of manufacturing devices are major causes of reduced productivity, which are a major problem in factory operations. Therefore, there is an increasing need for a state monitoring technology that predicts or promptly detects an abnormality in a device.

In addition, since manufacturing devices are not updated frequently, expectations are rising for the state monitoring technology that can be applied to existing devices that are not up-to-date.

Therefore, for example, Patent Literature 1 discloses a method in which an acceleration sensor is installed on a spindle head of a machine tool, frequency analysis is performed on information acquired from the sensor, and the state of the tool is detected using the obtained maximum amplitude frequency.

In addition, Patent Literature 2 discloses a method of using a current sensor to acquire information of a phase current of an induction motor installed in a manufacturing device, performing power spectrum analysis in an interval when the current is stable, and monitoring an abnormality of the motor from the amount of a sideband wave generated.

CITATION LIST

Patent Literatures

[Patent Literature 1] Japanese Patent Application Laid-Open No. 2012-076168
[Patent Literature 2] Japanese Patent Application Laid-Open No. 2016-195524

SUMMARY OF INVENTION

Technical Problem

The techniques of the above-described Patent Literatures 1 and 2 are techniques effective to monitor the state of a device.

However, Patent Literature 1 still has a problem with the installation of the sensor. Since an environment in which the sensor is installed is severe (high temperature, high humidity, a lot of dust, and the like) depending on the manufacturing device, there is a problem that the sensor fails or the like. In addition, a necessary number of sensors may not be able to be installed at necessary locations due to an insufficient physical space or the like. Furthermore, there is a sensor that is a vibration sensor or the like and cannot acquire an appropriate value when a method for the installation is not appropriately managed.

On the other hand, regarding the current sensor used in Patent Literature 2, a wiring to be measured is passed through the ring-shaped sensor regardless of whether the sensor is of a CT type, a hall element type, or a Rogowskii type, and special know-how is not required for the installation method. In addition, since the wiring of the motor can be installed in a good environment, such as inside an inverter board or in an electric room, such a problem of Patent Literature 1 hardly occurs in Patent Literature 2. However, in the method described in Patent Literature 2, it is necessary to diagnose an abnormality in an interval when the current is stable, and there is a problem that abnormality diagnosis cannot be performed on a device with load variations or frequent changes in the speed of the motor (variable speed operation).

An object of the present invention is to provide a device monitoring technique that has few restrictions even on application to existing devices and easily monitors a device to be monitored even when the device is in variable speed operation or under load variation.

Solution to Problems

To solve the above-described problems, a representative device monitoring device according to the present invention monitors a device system powered by an AC electric motor driven by an inverter and includes a torque current estimation unit and a state estimation unit.

The torque current estimation unit acquires information of alternating currents of at least two phases and an excitation current for the AC electric motor and calculates a torque current estimated value of the AC electric motor based on the alternating currents and the excitation current.

The state estimation unit estimates a state of the device system from information including at least one feature amount extracted from the torque current estimated value.

Advantageous Effects of Invention

According to the present invention, it is possible to provide a device monitoring technique that has few restrictions even on application to existing devices and easily monitors a manufacturing device to be monitored even when the device is in variable speed operation or under load variation.

Problems, configurations, and effects other than those described above are clarified from the following description of embodiments.

DESCRIPTION OF EMBODIMENTS

Representative embodiments of the present invention disclosed herein are described in detail. Reference signs in the drawings to be referenced merely exemplify parts included in the concept of constituent components to which the reference signs are given.

<Regarding Usefulness of Device Monitoring Using Torque Current>

First, the usefulness of device state monitoring using a torque current (Q axis current) that is a feature of the present invention is described.

FIG. 1 are diagrams illustrating temporal behaviors of alternating currents (motor currents) of three phases and a torque current in a case where the same load pattern is applied to a motor operated at a controlled rotational speed.

Figure 1A:
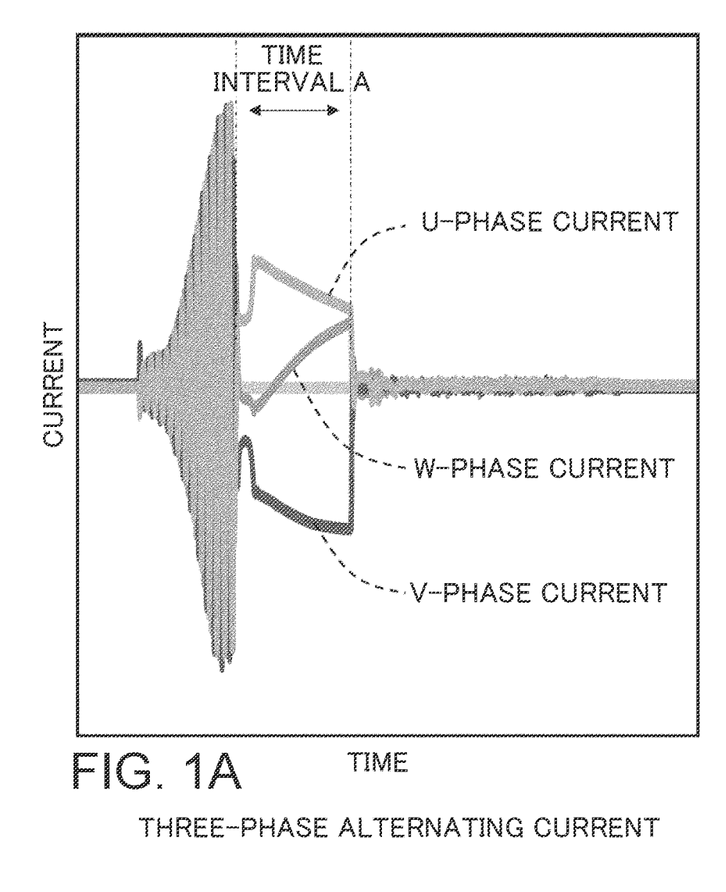
FIG. 1 are diagrams illustrating temporal behaviors of a three-phase alternating current and a torque current in a case where the same load pattern is given to a motor operated at a controlled rotational speed.

The horizontal axis of each diagram indicates time, while the vertical axis of each diagram indicates the magnitude of a current. FIG. 1(a) indicates a change in the three-phase alternating current. When the motor is operated at a controlled rotational speed, the current changes based on the magnitude of a load. Therefore, although the amplitude of the current changes over time, three phases change differently from each other. Therefore, it is difficult to appropriately determine the state of the load.

In addition, in the three-phase alternating current, when the position of a rotator is different, current patterns of the phases change and it is difficult to determine whether the load is the same.

Figure 1B:
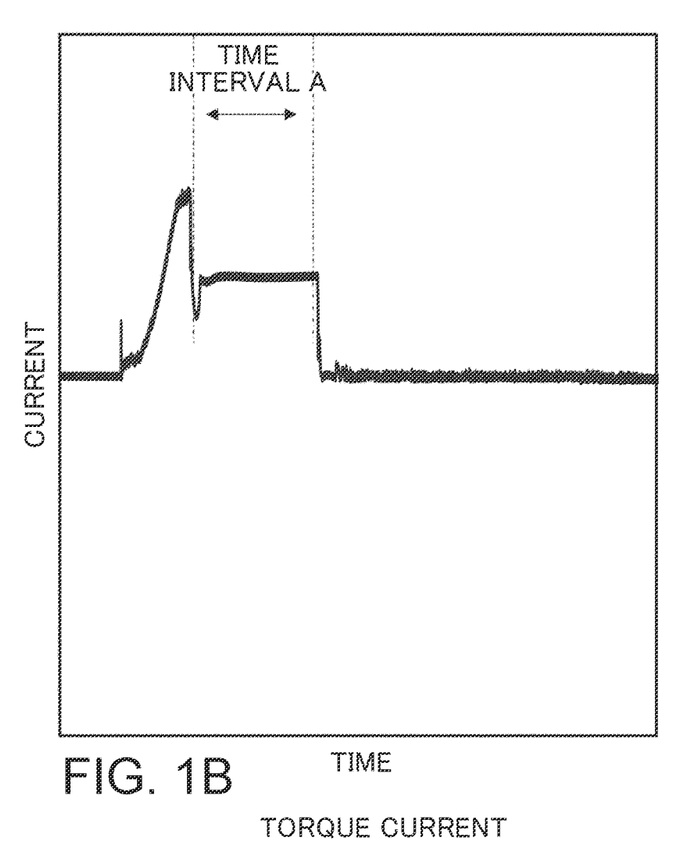

On the other hand, the torque current illustrated in FIG. 1(b) indicates a direct current value obtained by converting the three-phase alternating current into coordinate values based on information of the position of the rotator of the motor. For example, it can be more clearly determined that the load is constant for a time interval A illustrated in FIG. 1(b), compared with the three-phase alternating current.

In addition, even in a case where the position of the rotator is different, when the load is the same, the torque current constantly has the same current pattern. That is, a difference when the load changes in a different manner (abnormality) from a normal operation (normal), the torque current can be more clearly determined.

When the torque current is used in this manner, it is possible to appropriately determine a change in the load due to an abnormality of a device or a change in the state even during the time when the device is in variable speed operation or under load variation.

First Embodiment

Subsequently, a device and method for estimating a torque current without information of the position of the rotator that is hardly acquired from an existing device and monitoring the state of the device using the torque current are described below in detail on the premise of a device monitoring device that is retrofitted to the existing device.

<Description of Configuration Relating to Device Monitoring>

Figure 2:
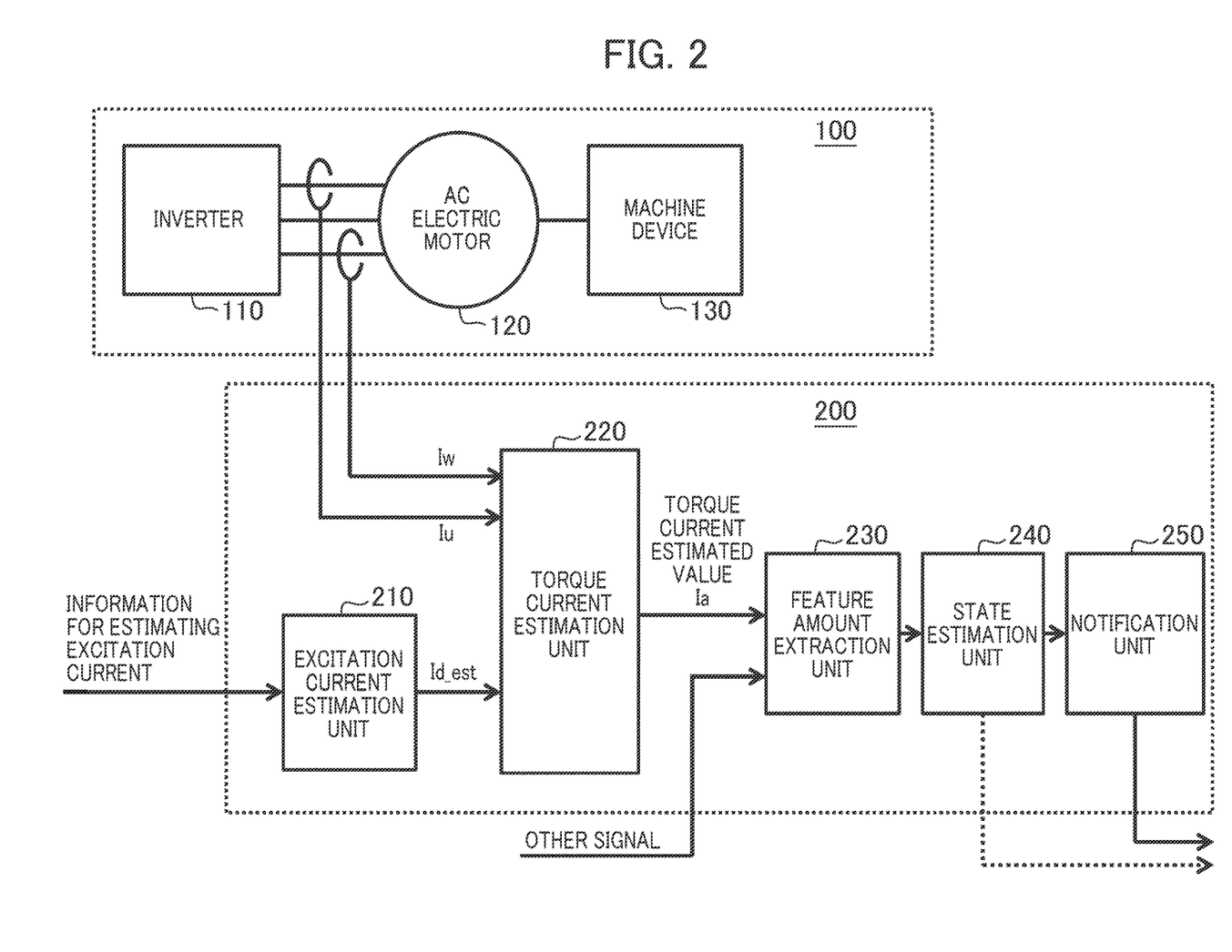
FIG. 2 is a diagram describing a configuration for device monitoring according to a first embodiment.

FIG. 2 is a diagram describing a configuration for device monitoring according to a first embodiment.

In the drawing, a target for the device monitoring is a device system 100 including an inverter 110, an AC electric motor 120 to be driven by the inverter 110, and a machine device 130 to be driven by the AC electric motor 120. Examples of the device system 100 that is the target for the device monitoring are devices connected to the AC electric motor to be driven by the inverter, such as a roller, a gear, a bearing, and a driving mechanism for a tool for a tool machine, and a wheel for a railway vehicle.

Meanwhile, a device monitoring device 200 includes an excitation current estimation unit 210, a torque current estimation unit 220, a feature amount extraction unit 230, a state estimation unit 240, and a notification unit 250.

The excitation current estimation unit 210 calculates an excitation current estimated value Id_est based on information for excitation current estimation.

The torque current estimation unit 220 acquires information of alternating currents (motor currents) of at least two phases for the AC electric motor 120 in chronological order in addition to the acquisition of information of the excitation current estimated value Id_est. In FIG. 2, information of a U-phase current Iu and a W-phase current Iw is input. However, information that can be converted into a combination of other phase currents, alternating currents of all the three phases, or alternating currents of two phases may be input. When information output of the alternating currents is present on the device system 100 side, the information is acquired. In addition, when information output of the alternating currents is not present like the existing device system 100, information of the alternating currents is acquired by retrofitting a ring-shaped current sensor to a wiring between the inverter 110 and the AC electric motor 120.

The torque current estimation unit 220 calculates a torque current estimated value Ia of the AC electric motor 120 based on the acquired information of the alternating currents and the excitation current estimated value Id_est.

The feature amount extraction unit 230 extracts a feature amount for the torque current estimated value Ia and another signal.

The state estimation unit 240 estimates the state of the device system 100 from information including the feature amount extracted from the torque current estimated value Ia.

The notification unit 250 outputs, as a monitoring result, the state of the device system 100 estimated by the state estimation unit 240 to the outside.

The device monitoring device 200 may be configured as a computer system including a CPU (central processing unit), a memory, and the like as hardware. Various functions as the device monitoring device are implemented by the hardware executing a device monitoring program stored in a computer-readable medium.

In addition, a part or all of the hardware may be replaced with a dedicated device, a general-purpose machine learning machine, a DSP (digital signal processor), an FPGA (field-programmable gate array), a GPU (graphics processing unit), a PLD (programmable logic device), or the like. In addition, by centralizing or distributing a part or all of the hardware and the program to a server on a network to configure a cloud system, various functions of the device monitoring device 200 may be provided as services to a plurality of client terminals (users).

Next, operations of each part of the device monitoring device 200 are explained in sequence.

<Description of Operation of Excitation Current Estimation Unit 210>

Figure 3:
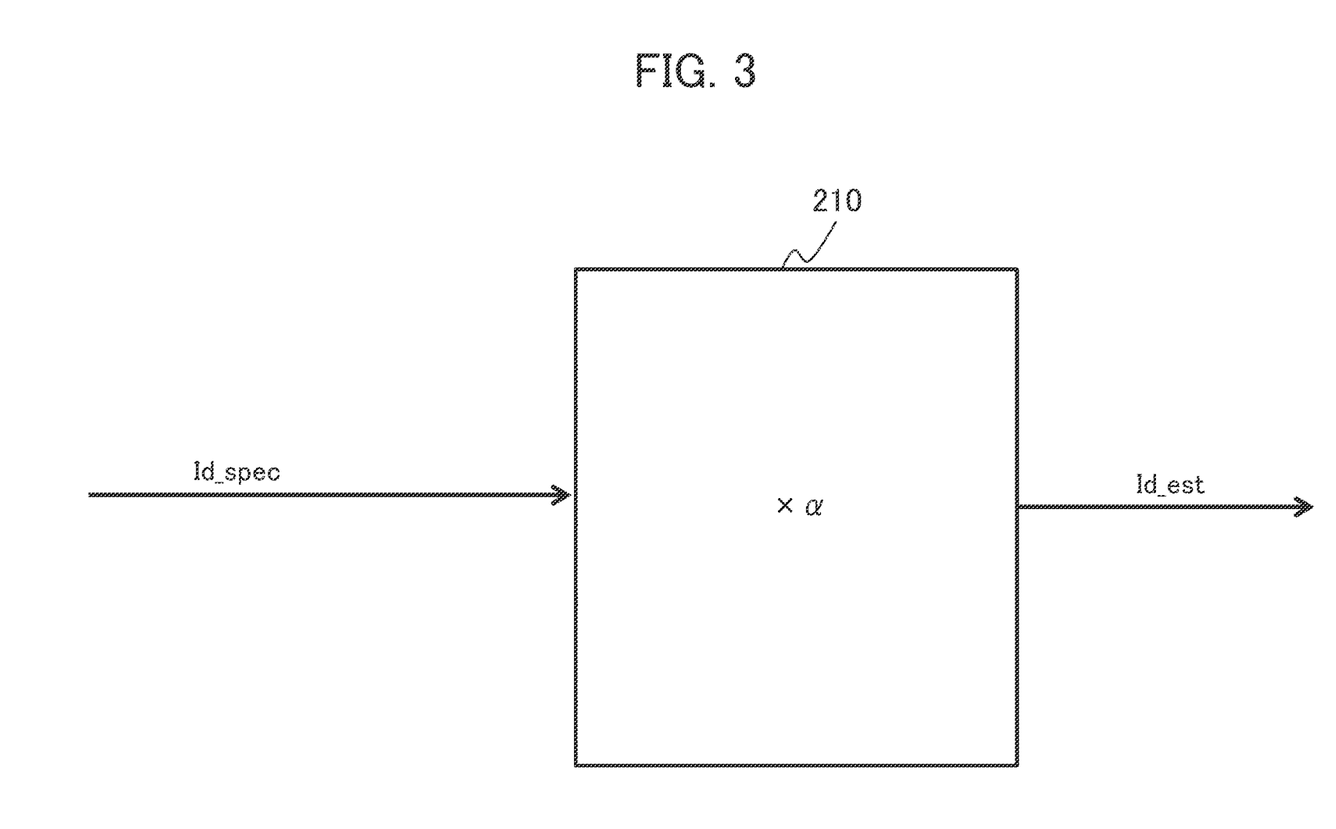
FIG. 3 is a diagram describing a processing operation of an excitation current estimation unit 210.

FIG. 3 is a diagram describing a processing operation of the excitation current estimation unit 210.

As illustrated in the drawing, a rated excitation current value Id_spec defined in product specifications (described in specifications, a catalog, or the like) of the inverter 110 or of the AC electric motor 120 is input to the excitation current estimation unit 210 as an information source for estimating an excitation current.

The excitation current estimation unit 210 calculates the excitation current estimated value Id_est corresponding to the rated excitation current value Id_spec. For example, the excitation current estimation unit 210 multiply the rated excitation current value Id_spec by a predetermined coefficient α to calculate the excitation current estimated value Id_est.

The coefficient α is a parameter for scaling and converting the excitation current estimated value such that it matches the scale of the alternating currents (U-phase current and W-phase current) in arithmetic processing of estimating the torque current by the torque current estimation unit 220. For example, the coefficient α is set to a range of positive real numbers including 1.0 (time) based on real measurement or a simulation operation.

By the above-described operation, the excitation current estimation unit 210 outputs the excitation current estimated value Id_est based on the product specifications.

<Description of Operation of Torque Current Estimation Unit 220>

Figure 4:
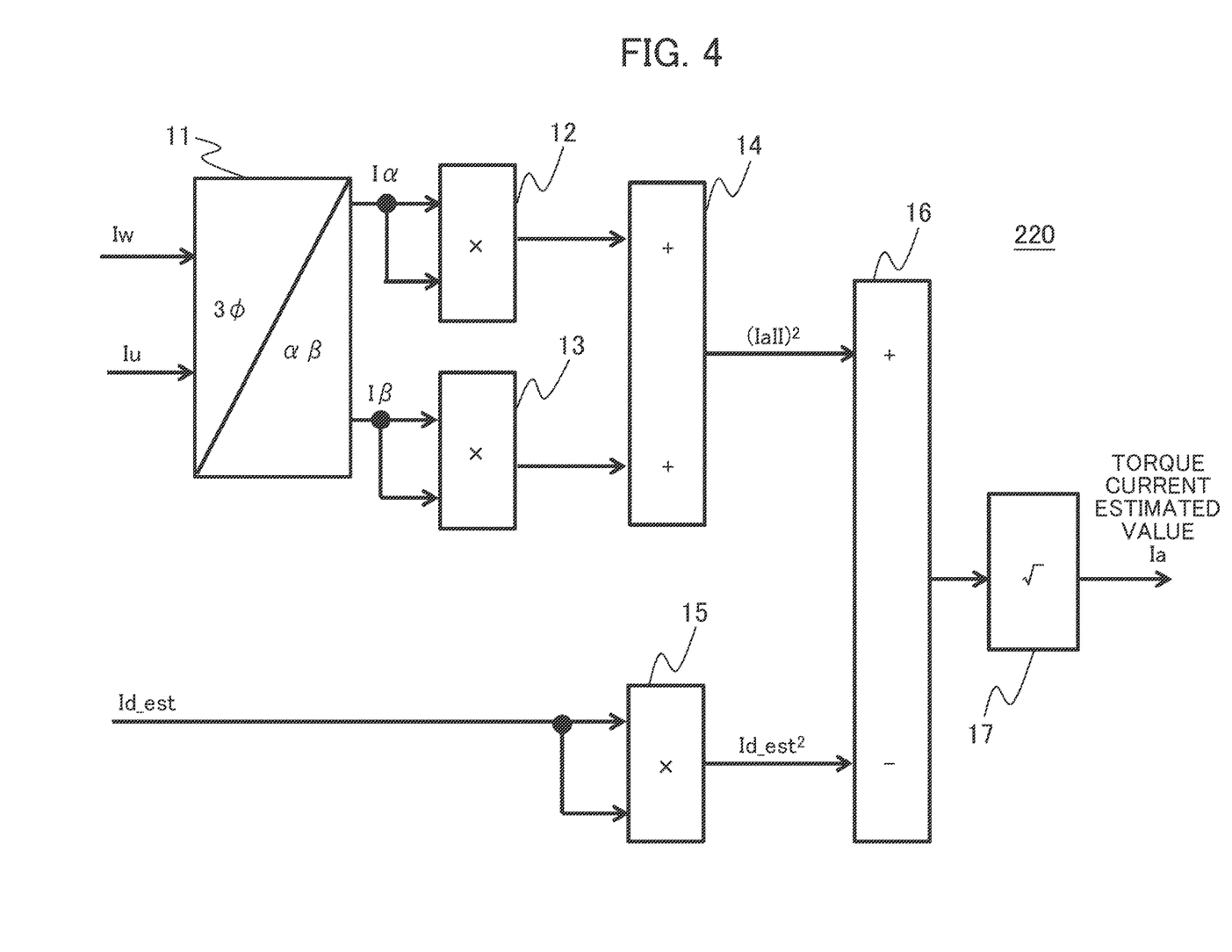
FIG. 4 is a diagram describing a processing operation of a torque current estimation unit 220.

FIG. 4 is a diagram describing a processing operation of the torque current estimation unit 220.

As illustrated in the drawing, the U-phase current Iu and the W-phase current Iw that have been input to the torque current estimation unit 220 are converted into two-phase current components Iα and Iβ by a three-phase to two-phase conversion unit 11.

Conversion equations of the three-phase to two-phase conversion unit 11 are expressed in (1) to (3).

First, in Equation (1), time-series data of a remaining V-phase current Iv is calculated based on time-series data of the U-phase current Iu and the W-phase current Iw. However, when the alternating currents of the three phases are input, it is not necessary to perform this calculation.

$$Iv=-(Iu+Iw) \quad (1)$$

Subsequently, the three-phase currents Iw, Iu, and Iv are converted into current components Iα and Iβ for two phases based on Equations (2) and (3).

$$I\alpha=(2/3)\{Iu-Iv/2-Iw/2\} \quad (2)$$

$$I\beta=(1/\sqrt{(3)})\{Iv-Iw\} \quad (3)$$

Another conversion equation for three-phase to two-phase conversion may be used to convert them into the current components Iα and Iβ for the two phases.

Next, squared values of the converted current components Iα and Iβ for the two phases are calculated by a multiplier 12 and a multiplier 13.

An adder 14 sums these two squared values to calculate a squared value $(I_{all})^2$ of all the currents. On the other hand, the multiplier 15 calculates a squared value $(Id\_est)^2$ of the excitation current estimated value Id_est.

A difference calculator 16 calculates the difference $[(I_{all})^2-(Id\_est)^2]$ between the squared value $(I_{all})^2$ of all the currents and the squared value $(Id\_est)^2$ of the excitation current estimated value.

A square root processing unit 17 calculates the square root of the difference $[(I_{all})^2-(Id\_est)^2]$ and outputs the square root as a torque current estimated value Ia.

By the above-described operation, the torque current estimation unit 220 outputs the torque current estimated value Ia in chronological order.

<Description of Operation of Feature Amount Extraction Unit 230>

Next, the feature amount extraction unit 230 is described.

The feature amount extraction unit 230 uses the input torque current estimated value Ia and another sensor signal (not necessarily time-series data) as necessary to calculate a feature amount necessary to estimate the state of the device system 100. This feature amount includes at least the feature amount calculated based on the torque current estimated value Ia.

The feature amount indicates a value representing characteristics of a waveform, for example, a statistical amount (for example, the average, the median, the standard deviation, the maximum value, the minimum value, the skewness, the kurtosis, the quantile, or the like), a derivative value, an integral value, or an instantaneous value of the time-series data in a time interval, the amplitude of a specific frequency when a frequency in the time interval is analyzed, a frequency value with a large peak, and an interval width (time width) of the time interval.

The time interval may be a selected interval corresponding to an operation or a process of a manufacturing device or may be selected according to a specific time (for example, for each regular interval of 10 seconds).

In addition, when a plurality of time-series data items are present, it is desirable to synthesize all the data items and select a time interval. In this case, sampling frequencies for the data items may not match each other.

By dividing the time-series data into data at certain time intervals and calculating the feature amount, it is possible to estimate the state of the device even if there is a load variation or the like.

By the above-described operation, the feature amount extraction unit 230 outputs the feature amount based on at least the torque current estimated value in chronological order.

<Description of Operation of State Estimation Unit 240>

The state estimation unit 240 uses the feature amount extracted in chronological order to estimate the state of the device system 100.

For example, a threshold is set for the input feature amount and the state of the device is determined based on whether the feature amount is larger or smaller than the threshold.

In addition, for example, it is possible to use a plurality of feature amounts to input the feature amounts to a model (regression model, classification model, cluster model, neural network model, or the like) statistically generated in advance or generated using machine learning, AI, or the like to estimate the state of the device. A result of the estimation may be a discrete expression such as normal or abnormal or may be a continuous value or a stepwise level expression.

<Description of Operation of Notification Unit 250>

The notification unit 250 uses means such as a character, audio, light, vibration, or the like to notify an external (for example, an administrator of the device system 100 or a management system) of time-series information of the result of the estimation. As described above, even when the device system 100 to be monitored is in variable speed operation or under load variation, it is possible to monitor the state of the device.

Effects of First Embodiment (1) In the first embodiment, the state estimation unit 240 monitors the state of the device system 100 based on a feature amount of an estimated torque current. In a case where it is based on the torque current, even when the device system 100 is in variable speed operation or under load variation as described above using FIG. 1, it is possible to detect an abnormality of the device system 100 and a change in the state.

(2) In general, many device systems 100 for existing facilities do not output information regarding a torque current. Therefore, it has been difficult to monitor the device systems 100 based on a torque current.

To avoid this, in the first embodiment, the torque current estimation unit 220 is provided to estimate the torque current of the AC electric motor 120 based on alternating currents of at least two phases and the excitation current for the AC electric motor 120. In the first embodiment, by estimating the torque current in this manner, it is possible to perform the device monitoring on the existing device system 100 that does not output information regarding the torque current.

(3) In the first embodiment, the torque current estimation unit 220 performs the three-phase to two-phase conversion on the alternating currents (Iw and Iu in FIG. 2) for at least the two phases to calculate the current components Iα and Iβ for the two phases, subtracts the squared value of the estimated value of the excitation current from the sum of the squares of the current components Iα and Iβ, and calculates the square root of the subtracted squared value to calculate the torque current estimated value. By performing this arithmetic processing to calculate the torque current estimated value, it is possible to calculate the torque current estimated value based on the alternating currents and the excitation current that are supplied to the AC electric motor 120 at any time.

(4) In addition, in a device system 100 for an existing facility, in order to directly sense information regarding a torque current, it is necessary to retrofit a mechanical dedicated sensor or the like for an operational environment of the device system 100.

In general, the operational environment of the device system 100 is severe in many cases and there is a possibility of failure in the mechanical dedicated sensor or the like. Therefore, there is a problem that the reliability of a result of monitoring the device system 100 is lowered because it is not known when the mechanical dedicated sensor or the like fails. As a result, the burden is excessive since maintenance is carried out on a daily basis.

To avoid this, in the first embodiment, a ring-type current sensor that can be easily retrofitted detects the alternating currents of the two phases in a wiring between the inverter 110 and the AC electric motor 120 as exemplified in FIG. 2. Therefore, it is possible to position the current sensor away from the severe operational environment of the device system 100. Therefore, the current sensor hardly fails and it is possible to improve the reliability of the monitoring result and reduce a maintenance load in the first embodiment.

(5) In the first embodiment, information of a rated value of the excitation current is acquired based on specification data of the inverter 110 or of the AC electric motor 120 and an excitation current estimated value is calculated based on the rated value of the excitation current.

In a case where the excitation current is stable regardless of the operational state of the device system 100 and a change in the device system 100 over time, it is possible to excellently estimate the excitation current based on the rated value of the excitation current.

In addition, in such a method for estimating the excitation current, it is possible to omit measurement regarding the excitation current and thus it is possible to simplify the configuration of the device monitoring device 200.

Second Embodiment

Subsequently, a second embodiment is described. Since a configuration in the second embodiment is the same as or similar to the configuration (FIGS. 2 and 4) described in the first embodiment, except that an excitation current estimation unit 210A is used, a duplicate description about the configuration is omitted.

A feature of the second embodiment is that the excitation current estimation unit 210A estimates the excitation current using speed information relating to the speed of the AC electric motor 120 or of the machine device 130.

Figure 5:
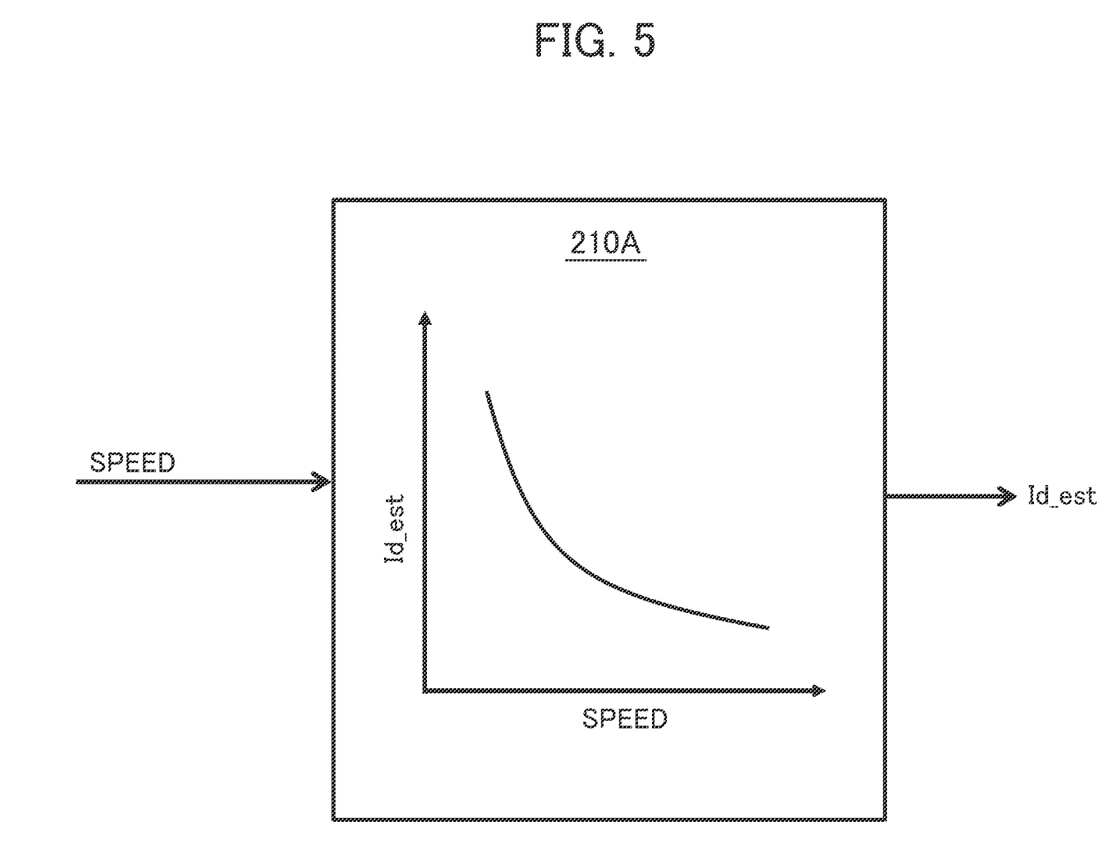
FIG. 5 is a diagram describing a processing operation of an excitation current estimation unit 210A according to a second embodiment.

FIG. 5 is a diagram describing a processing operation of the excitation current estimation unit 210A according to the second embodiment.

As illustrated in the drawing, speed information Speed relating to the speed of the AC electric motor 120 or of the machine device 130 is input to the excitation current estimation unit 210A as an information source for estimating the excitation current.

As the speed information Speed relating to the speed, for example, sensor information sensed by a speed sensor attached to the AC electric motor 120 or to the machine device 130, a speed command value given to the AC electric motor 120 or to the machine device 130, or the like is used.

The excitation current estimation unit 210A calculates an excitation current estimated value Id_est corresponding to the speed information Speed relating to the speed. For example, the excitation current estimation unit 210A inputs (inquires) the speed information Speed relating to the speed to, for example, a predetermined map or a predetermined function to calculate the excitation current estimated value Id_est.

As a method for generating the function or the map, it is preferable to use a correspondence relationship (dynamic or static correspondence relationship) between "the speed and the excitation current value" described in the product specifications of the AC electric motor 120 or of the inverter 110 or a relationship (data) between a motor (machine device) speed and an excitation current of a similar device. In addition, the function or the map may be generated based on a simulation operation as well as actual measured data. A plurality of such functions or maps may be defined in a selectable manner according to a condition for the operation of the device system 100.

Since operations of other units in the second embodiment are the same as or similar to those in the first embodiment, a duplicate description is omitted in this embodiment.

Effects of Second Embodiment

In the second embodiment, effects similar to the effects (1) to (4) described above in the first embodiment can be obtained.

In addition, according to the second embodiment, even when the excitation current changes according to the speed of the machine device 130, the excitation current estimation unit 210A can estimate the excitation current with high accuracy. As a result, the torque current estimation unit 220 can calculate the torque current estimated value with high accuracy based on the highly accurate excitation current and alternating currents of at least two phases. Therefore, in the second embodiment, it is possible to monitor the state of the device system 100 based on the highly accurate torque current estimated value.

Third Embodiment

In addition, a third embodiment is described. Since a configuration in the third embodiment is the same as or similar to the configuration (FIGS. 2 and 4) described in the first embodiment, except that an excitation current estimation unit 210B is used, a duplication description about the configuration is omitted.

A feature of the third embodiment is that the excitation current estimation unit 210B estimates the excitation current using a phase current of the AC electric motor 120 and a line voltage.

Figure 6:
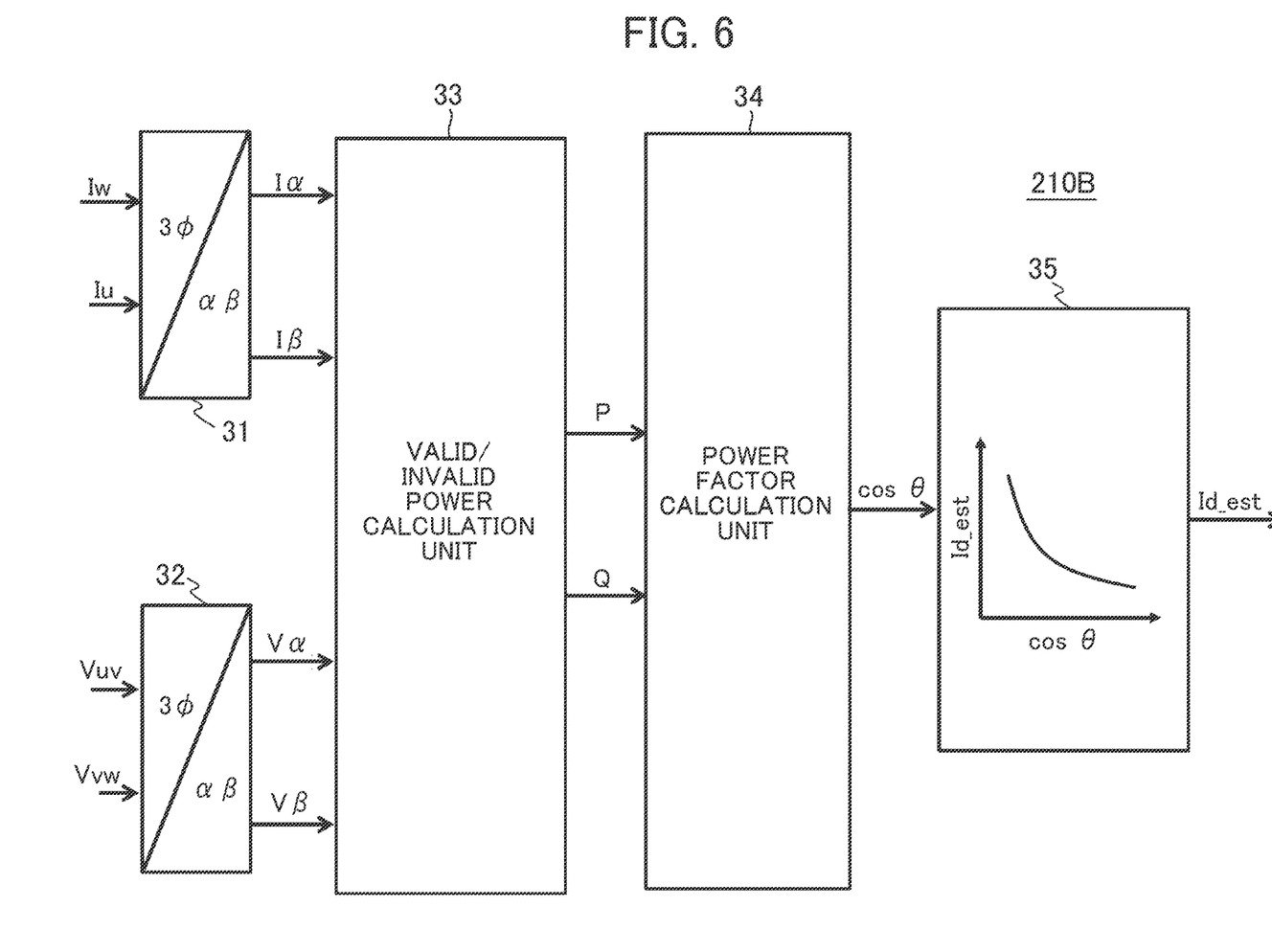
FIG. 6 is a diagram describing a processing operation of an excitation current estimation unit 210B according to a third embodiment.

FIG. 6 is a diagram describing a processing operation of the excitation current estimation unit 210B according to the third embodiment.

In the drawing, the excitation current estimation unit 210B includes a three-phase to two-phase current conversion unit 31, a three-phase to two-phase voltage conversion unit 32, a valid/invalid power calculation unit 33, a power factor calculation unit 34, and a power factor conversion unit 35.

The three-phase to two-phase conversion unit 31 acquires information of alternating currents of at least two phases for the AC electric motor 120 in chronological order. In FIG. 6, although information of the U-phase current Iu and the W-phase current Iw is input, information that can be converted into a combination of other phase currents, alternating currents of all the three phases, or alternating currents of two phases may be input. The three-phase to two-phase conversion unit 31 performs three-phase to two-phase conversion to convert the alternating currents into current components Iα and Iβ for two phases in the same manner as in the first embodiment.

On the other hand, the three-phase to two-phase conversion unit 32 acquires at least two line voltages for the AC electric motor 120. In FIG. 6, although information of a voltage Vuv between U and V and a voltage Vvw between V and W is input, information that can be converted into a combination of other line voltages, all three line voltages, or two line voltages may be input.

The three-phase to two-phase conversion unit 32 converts the acquired line voltages based on Equations (4) to (8) to calculate voltage components Vα and Vβ for two phases. Equations (4) to (6) are equations for calculating phase voltages from the line voltages. Equations (7) to (8) are equations for calculating Vα and Vβ. When line voltages are three patterns (U-V, V-W, and W-U) already measured, processing for Equation (9) may be performed instead of Equation (6), for example.

$$Vu=(2/3)\cdot\{Vuv+Vvw/2\} \quad (4)$$

$$Vw=-(2/3)\cdot\{Vvw+Vuv/2\} \quad (5)$$

$$Vv=-(Vu+Vw) \quad (6)$$

$$V\alpha=(2/3)\{Vu-Vv/2-Vw/2\} \quad (7)$$

$$V\beta=(1/\sqrt{(3)})\{Vv-Vw\} \quad (8)$$

$$Vv=(2/3)\cdot\{Vvw+Vwu/2\} \quad (9)$$

The output of the three-phase to two-phase conversion unit 31 and the output of the three-phase to two-phase conversion unit 32 are input to the valid/invalid power calculation unit 33 in chronological order. The valid/invalid power calculation unit 33 calculates valid power P and invalid power Q based on Equations (10) and (11).

$$P=3/2\cdot(I\alpha\cdot V\alpha+I\beta\cdot V\beta) \quad (10)$$

$$Q=3/2\cdot(-I\alpha\cdot V\beta+I\beta\cdot V\alpha) \quad (11)$$

The calculated valid power P and the calculated invalid power Q are input to the power factor calculation unit 34 in chronological order. The power factor calculation unit 34 calculates a power factor cos θ based on Equation (12).

$$\cos\theta=P/\sqrt{(P^2+Q^2)} \quad (12)$$

The calculated power factor cos θ is input to the power factor conversion unit 35 in chronological order. The power factor conversion unit 35 calculates the excitation current estimated value Id_est based on the power factor cos θ. An example of a method for calculating the excitation current estimated value Id_est is a method for setting the function or the map such that the excitation current estimated value is uniquely determined. An example of a method for generating the function or the map is a method using a relationship (data) of the excitation current value with the power factor described in the product specifications of the motor or of the inverter or a relationship (data) between an excitation current and a power factor of a similar device. A plurality of such functions or maps may be defined in a selectable manner according to a condition for an operation.

Since operations of other units in the third embodiment are the same as or similar to those in the first embodiment, a duplicate description is omitted in this embodiment.

Effects of Third Embodiment

In the third embodiment, effects similar to the effects (1) to (4) described above in the first embodiment can be obtained.

In addition, according to the third embodiment, the excitation current estimation unit 210B acquires information of at least two line voltages and information of alternating currents of at least two phases, calculates a power factor based on the line voltages and the alternating currents, and calculates an estimated value of the excitation current based on the power factor. Therefore, even in a case where the excitation current is controlled to change according to the power factor, it is possible to estimate the torque current with high accuracy. As a result, the torque current estimation unit 220 can calculate a highly accurate torque current estimated value based on the highly accurate excitation current and alternating currents of at least two phases. Therefore, in the third embodiment, it is possible to monitor the state of the device system 100 based on the highly accurate torque current estimated value.

Fourth Embodiment

Subsequently, a fourth embodiment is described. Since a configuration in the fourth embodiment is the same as or similar to the configuration (FIGS. 2 and 4) described in the first embodiment, except that an excitation current estimation unit 210C is used, a duplication description about the configuration is omitted.

Figure 7:
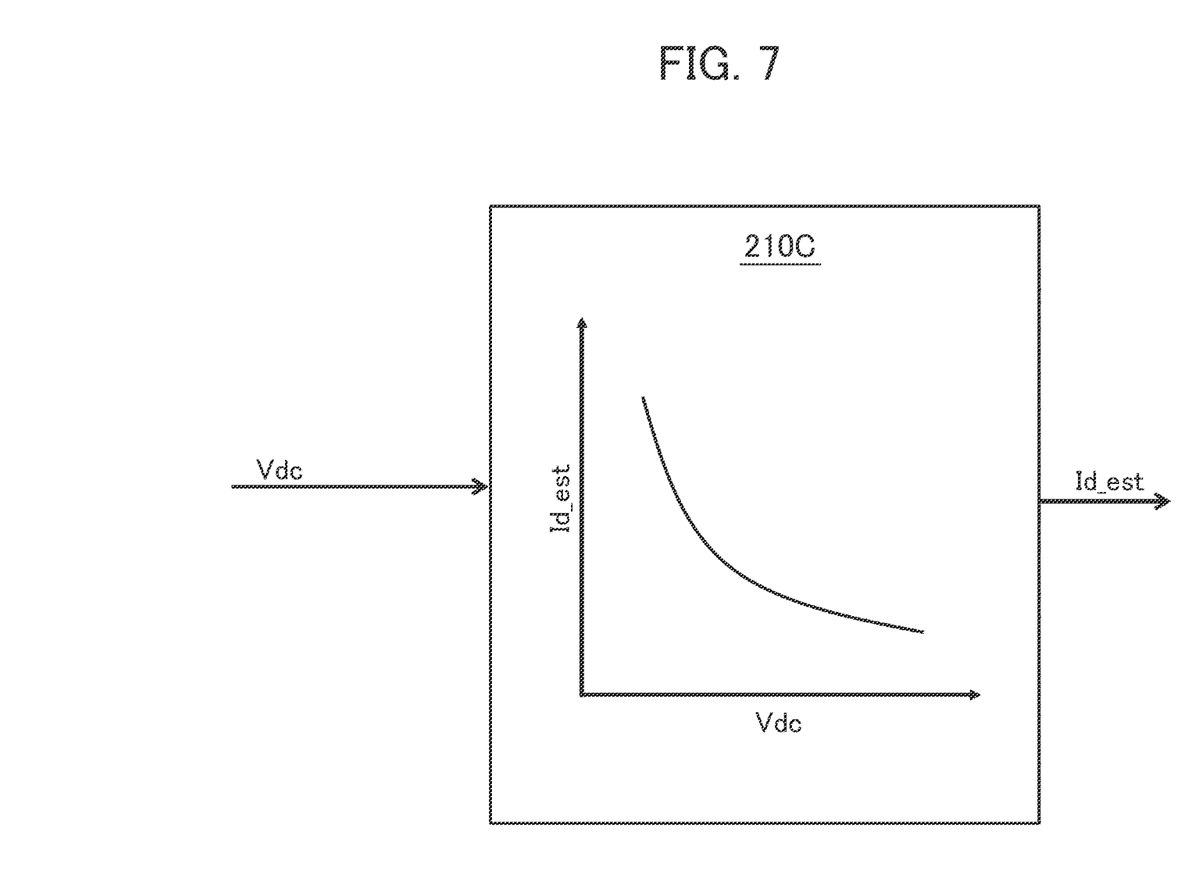
FIG. 7 is a diagram describing a processing operation of an excitation current estimation unit 210C according to a fourth embodiment.

A feature of the fourth embodiment is that the excitation current estimation unit 210C estimates an excitation current based on an input direct current voltage Vdc input to the inverter 110, and other processing is the same.

FIG. 7 is a diagram describing a processing operation of the excitation current estimation unit 210C according to the fourth embodiment.

As illustrated in the drawing, information of the input direct current voltage Vdc input to the inverter 110 is input to the excitation current estimation unit 210C as an information source for estimating the excitation current.

The excitation current estimation unit 210C calculates an excitation current estimated value Id_est corresponding to the information of the input direct current Vdc. For example, the excitation current estimation unit 210C calculates the excitation current estimated value Id_est by inputting the information of the input direct current voltage Vdc to a predetermined map or a predetermined function, for example.

Examples of a method for generating the function or the map are a method using a relationship (data) of an excitation current value with an input direct current voltage described in the product specifications of the AC electric motor 120 or of the inverter 110, and a method using a relationship (data) between an input direct current voltage and an excitation current of a similar device. In addition, the function or the map may be generated based on a simulation operation in addition to actual measured data. A plurality of such functions or maps may be defined in a selectable manner according to a condition for an operation.

Operations of other units in the fourth embodiment are the same as or similar to those described in the first embodiment, and a duplicate description is omitted in this embodiment.

Effects of Fourth Embodiment

In the fourth embodiment, effects similar to the effects (1) to (4) described above in the first embodiment can be obtained.

In addition, according to the fourth embodiment, the excitation current estimation unit 210C calculates the excitation current estimated value Id_est based on the input direct current voltage Vdc of the inverter 110. Therefore, even in a case where the excitation current changes according to the input direct current voltage Vdc of the inverter 110, it is possible to estimate the excitation current with high accuracy. As a result, the torque current estimation unit 220 can calculate the torque current estimated value with high accuracy based on the highly accurate excitation current and alternating currents of at least two phases. Therefore, in the fourth embodiment, it is possible to monitor the state of the device system 100 based on the highly accurate torque current estimated value.

Fifth Embodiment

Next, a fifth embodiment is described. A configuration in the fifth embodiment is the same as or similar to the configuration (FIGS. 2 and 4) described in the first embodiment, except that an excitation current estimation unit 210D is used, a duplicate description about the configuration is omitted.

Figure 8:
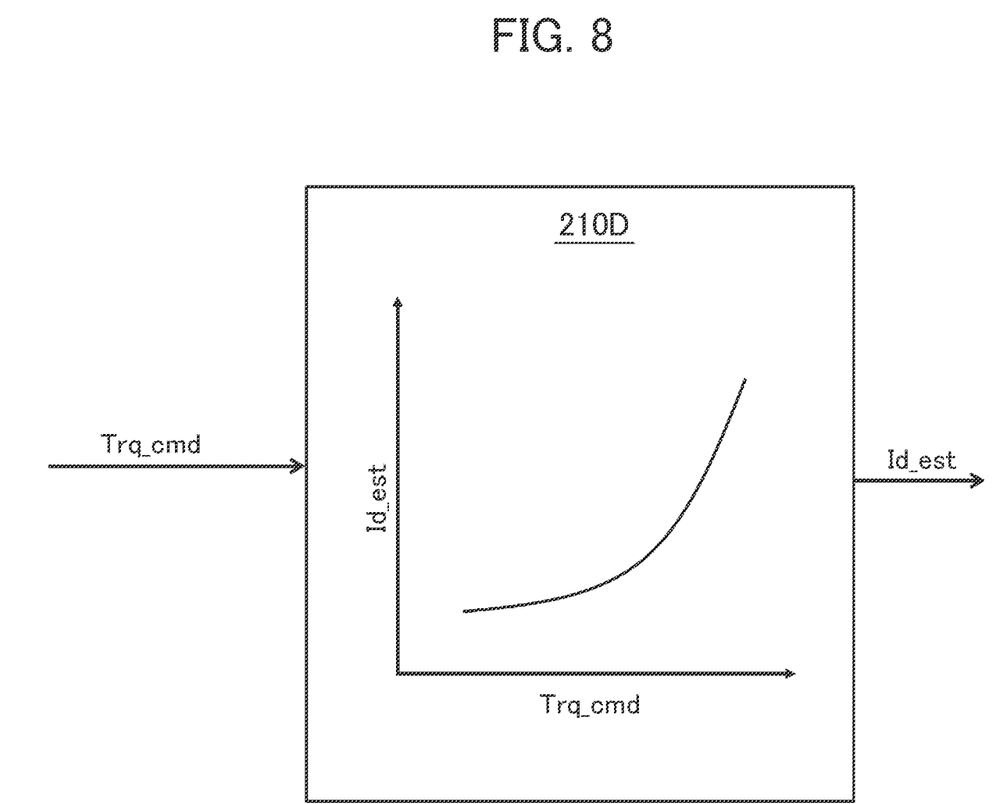
FIG. 8 is a diagram describing a processing operation of an excitation current estimation unit 210D according to a fifth embodiment.

A feature of the fifth embodiment is that the excitation current estimation unit 210D estimates an excitation current using a torque command value Trq_cmd, and other processing is the same.

FIG. 8 is a diagram describing a processing operation of the excitation current estimation unit 210D according to the fifth embodiment.

As illustrated in the drawing, the torque command value Trq_cmd is input to the excitation current estimation unit 210D as an information source for estimating the excitation current.

The excitation current estimation unit 210D calculates the excitation current estimated value Id_est corresponding to the torque command value Trq_cmd. For example, the excitation current estimation unit 210D calculates the excitation current estimated value Id_est by inputting (inquiring) the torque command value Trq_cmd to a predetermined map or a predetermined function, for example.

Examples of a method for generating the function or the map are a method using a relationship (data) of an excitation current value with a torque command value described in the product specifications of the AC electric motor 120 or of the inverter 110, and a method using a relationship (data) between a torque command value and an excitation current of a similar device. A plurality of such functions or maps may be defined in a selectable manner according to a condition for an operation.

Operations of other units in the fifth embodiment are the same as or similar to those described in the first embodiment, and a duplicate description is omitted in this embodiment.

Effects of Fifth Embodiment

In the fifth embodiment, effects similar to the effects (1) to (4) described above in the first embodiment can be obtained.

In addition, according to the fifth embodiment, the excitation current estimation unit 210D calculates an estimated value of the excitation current based on the torque command value Trq_cmd of the AC electric motor 120. Therefore, even in a case where the excitation current is controlled to change according to the torque command value, it is possible to accurately estimate the torque current. As a result, the torque current estimation unit 220 can calculate the torque current estimated value with high accuracy based on the highly accurate excitation current and alternating currents of at least two phases. Therefore, in the fifth embodiment, it is possible to monitor the state of the device system 100 based on the highly accurate torque current estimated value.

Sixth Embodiment

Subsequently, an embodiment in which device control is performed in addition to the device monitoring in the device monitoring device 200 according to each of the first to fifth embodiments is described.

Figure 9:
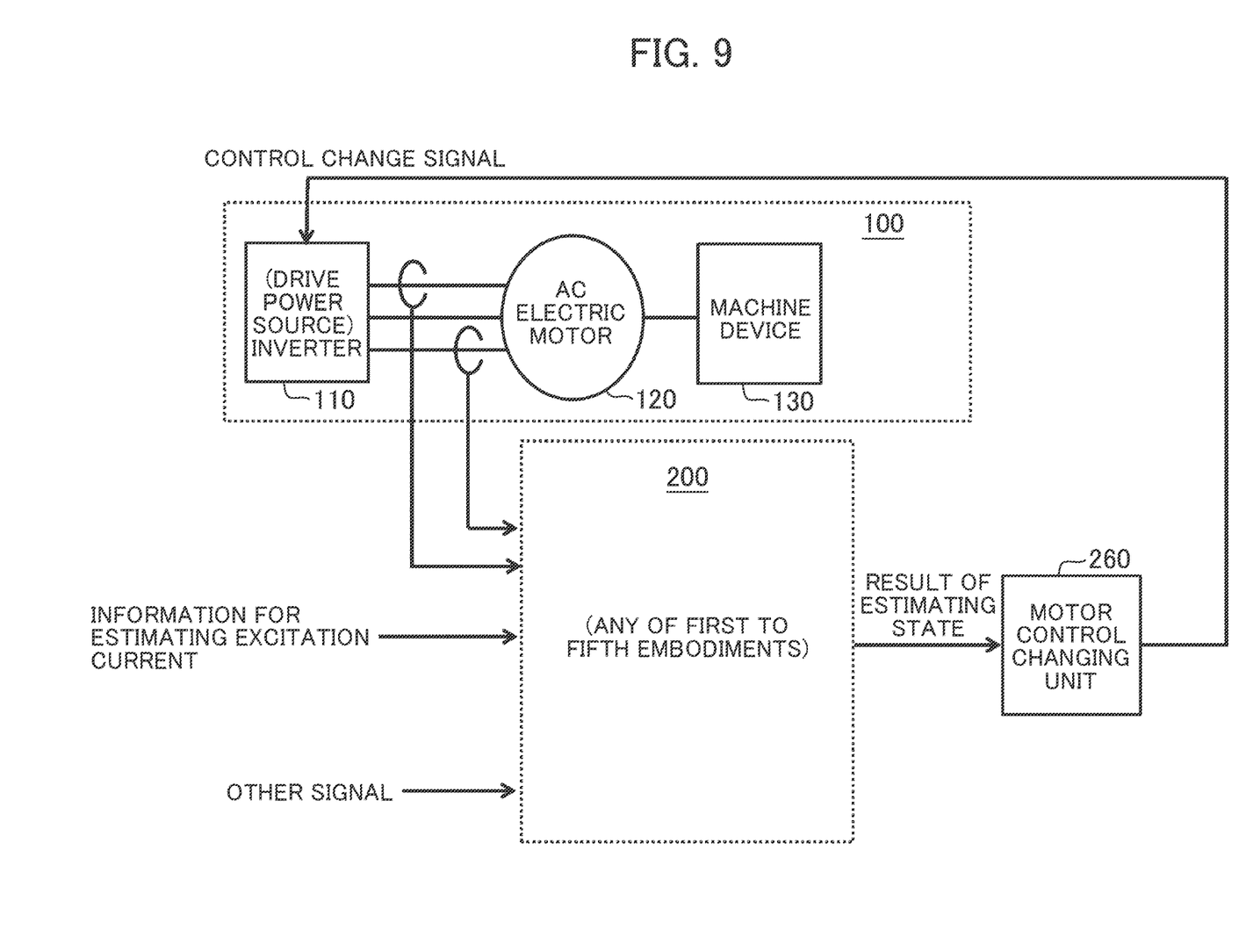
FIG. 9 is a diagram describing a configuration for device monitoring and device control according to a sixth embodiment.

FIG. 9 is a diagram describing a configuration for the device monitoring and the device control in the sixth embodiment.

In the drawing, the device monitoring device 200 may be the device monitoring device 200 according to any of the first to fifth embodiments. A result of estimating the state of the device system 100 is output by the device monitoring device 200 (the state estimation unit 240 or the notification unit 250 in the device monitoring device 200) and input to a motor control changing unit 260. The motor control changing unit 260 changes control of the device system (for example, the inverter 110 in FIG. 9) based on the result of estimating the state of the device system 100.

For example, the motor control changing unit 260 confirms a difference between the result of estimating the state of the device system 100 and a target state of the device system 100. Then, the motor control changing unit 260 generates a control change signal for the device system 100 (for example, the inverter 110) so that the result of estimating the state of the device system 100 becomes close to the target state. The control change signal is a signal such as a position command to be given to the inverter 110 or the like, a rotational speed command, a torque command, or a gain or parameter for motor control. In this case, the value of the control change signal is calculated by outputting a value determined in advance according to the difference from the target state or by inputting the difference from the target state to a calculation formula determined in advance.

In this case, the control change signal may be of one type or may be a plurality of signals. When the plurality of control change signals are used, it is preferable to determine, in advance, a rule for determining which type of signal is changed on a priority basis.

Since other configurations and operations are the same as or similar to those described in the first to fifth embodiments, a duplicate description is omitted in this embodiment.

Effects of Sixth Embodiment

In the sixth embodiment, in addition to the effects of the first to fifth embodiments described above, the following effects are obtained.

According to the device control in the sixth embodiment, it is possible to change the control of the device system 100 according to the result of estimating the state of the device system 100. Therefore, it is possible to suppress a sudden mechanical failure and suppress rapid mechanical degradation by performing fallback by changing the control of the AC electric motor 120 or the like.

Supplementary Items of Embodiments

The present invention is not limited to the embodiments described above and include various modifications. For example, the embodiments are described above to clearly explain the present invention and are not necessarily limited to the embodiments including all the configurations described above.

In addition, a part of a configuration described in a certain one of the embodiments can be replaced with a configuration described in another one of the embodiments. Furthermore, a configuration described in a certain one of the embodiments can be added to a configuration described in another one of the embodiments.

Furthermore, for a part of the configuration described in each of the embodiments, the addition, removal, and replacement of another configuration can be made.

LIST OF REFERENCE SIGNS

11 . . . Three-phase to two-phase conversion unit, 12 . . . Multiplier, 13 . . . Multiplier, 14 . . . Adder, 15 . . . Multiplier, 16 . . . Difference calculator, 17 . . . Square root processing unit, 31 . . . Three-phase to two-phase current conversion unit, 32 . . . Three-phase to two-phase voltage conversion unit, 33 . . . Valid/invalid power calculation unit, 34 . . . Power factor calculation unit, 35 . . . Power factor conversion unit, 100 . . . Device system, 110 . . . Inverter, 120 . . . AC electric motor, 130 . . . Machine device, 200 . . . Device monitoring device, 210 . . . Excitation current estimation unit, 210A . . . Excitation current estimation unit, 210B . . . Excitation current estimation unit, 210C . . . Excitation current estimation unit, 210D . . . Excitation current estimation unit, 220 . . . Torque current estimation unit, 230 . . . Feature amount extraction unit, 240 . . . State estimation unit, 250 . . . Notification unit, 260 . . . Motor control changing unit

The invention claimed is:

1. A device monitoring device that is powered by an AC electric motor driven by an inverter, the device comprising:

a torque current estimation unit that acquires information of alternating currents of at least two phases and an excitation current for the AC electric motor and calculates a torque current estimated value of the AC electric motor based on the alternating currents and the excitation current; and a state estimation unit that estimates a state of the device system from information including a feature amount extracted from the torque current estimated value; and wherein the torque current estimation unit calculates the torque current estimated value by calculating current components $I\alpha$ and $I\beta$ from the alternating currents by performing three-phase to two-phase conversion, subtracting a squared value of the excitation current from a sum of squares of the current components $I\alpha$ and $I\beta$, and calculating a square root of the subtracted squared value.

2. The device monitoring device according to claim 1, further comprising an excitation current estimation unit that acquires information of a rated value of the excitation current based on specification data of the inverter or of the AC electric motor and calculates an estimated value of the excitation current based on the rated value of the excitation current.

3. The device monitoring device according to claim 1, further comprising an excitation current estimation unit that acquires speed information of driving for the AC electric motor or for the device system and calculates an estimated value of the excitation current based on the speed information.

4. The device monitoring device according to claim 1, further comprising an excitation current estimation unit that acquires information of at least two line voltages and the alternating currents of the at least two phases, calculates a power factor based on the line voltages and the alternating currents, and calculates an estimated value of the excitation current based on the power factor.

5. The device monitoring device according to claim 1, further comprising an excitation current estimation unit that calculates an estimated value of the excitation current based on an input direct current voltage of the inverter.

6. The device monitoring device according to claim 1, further comprising an excitation current estimation unit that calculates an estimated value of the excitation current based on a torque command of the AC electric motor.

7. The device monitoring device according to claim 1, further comprising a motor control changing unit that changes control of the device system based on a result of estimating the state by the state estimation unit.

8. The device monitoring device according to claim 2, further comprising a motor control changing unit that changes control of the device system based on a result of estimating the state by the state estimation unit.

9. The device monitoring device according to claim 3, further comprising a motor control changing unit that changes control of the device system based on a result of estimating the state by the state estimation unit.

10. The device monitoring device according to claim 4, further comprising a motor control changing unit that changes control of the device system based on a result of estimating the state by the state estimation unit.

11. The device monitoring device according to claim 5, further comprising
   a motor control changing unit that changes control of the device system based on a result of estimating the state by the state estimation unit.

12. The device monitoring device according to claim 6, further comprising
   a motor control changing unit that changes control of the device system based on a result of estimating the state by the state estimation unit.

13. The device monitoring device according to claim 1, further comprising
   a motor control changing unit that changes control of the device system based on a result of estimating the state by the state estimation unit.

\* \* \* \* \*